United States Patent [19]

Shaka

[11] Patent Number: 4,710,718

[45] Date of Patent: Dec. 1, 1987

[54] SPATIALLY SELECTIVE NUCLEAR MAGNETIC RESONANCE PULSE SEQUENCES

[75] Inventor: Athan J. Shaka, Oxford, United Kingdom

[73] Assignee: Varian Associates, Inc., Palo Alto, Calif.

[21] Appl. No.: 807,098

[22] PCT Filed: Apr. 4, 1985

[86] PCT No.: PCT/US85/00593
§ 371 Date: Dec. 3, 1985
§ 102(e) Date: Dec. 3, 1985

[87] PCT Pub. No.: WO85/04727
PCT Pub. Date: Oct. 24, 1985

[30] Foreign Application Priority Data

Apr. 5, 1984 [AU] Australia .............................. PG4432

[51] Int. Cl.⁴ ............................................. G01R 33/20
[52] U.S. Cl. ...................................... 324/309; 324/314
[58] Field of Search ................ 324/300, 307, 309, 310, 324/311, 312, 314

[56] References Cited

U.S. PATENT DOCUMENTS

| | | | |
|---|---|---|---|
| 3,474,329 | 10/1969 | Waugh .................................. | 324/311 |
| 3,787,760 | 1/1974 | Keller et al. ......................... | 324/311 |
| 4,021,726 | 5/1977 | Garroway et al. .................. | 324/309 |
| 4,068,161 | 1/1978 | Ernst ..................................... | 324/311 |
| 4,297,637 | 10/1981 | Crooks et al. ....................... | 324/307 |
| 4,318,043 | 3/1982 | Crooks et al. ....................... | 324/309 |
| 4,431,968 | 2/1984 | Edelstein et al. .................... | 324/309 |
| 4,438,400 | 3/1984 | Patt ...................................... | 324/307 |
| 4,471,305 | 9/1984 | Crooks et al. ....................... | 324/309 |
| 4,486,709 | 12/1984 | Bendall ................................ | 324/309 |

OTHER PUBLICATIONS

Levitt et al., "NMR Population Inversion Using a Composite Pulse", J. Magn. Reson. 33, 473–476, 1979.
Freeman et al., "Radiofrequency Pulse Sequences Which Compensate Their Own Imperfections", J. Magn. Reson., 38, 453–479, 1980.
Levitt et al., "Compensation for Pulse Imperfections in NMR Spin-Echo Experiments", J. Magn. Reson., 43, 65–80, 1981.
Levitt et al., "Composite Pulse Decoupling", J. Magn. Reson., 43, 502–507, 1981.
Shaka et al., "An Improved Sequence For Broadband Decoupling: WALTZ-16", J. Magn. Reson., 52, 335–338, 1983.

Freeman et al., "Suppression of Artifacts in Two-Dimensional J Spectra", J. Magn. Reson., 43, 484–487, 1981.
Waugh, "Systematic Procedure For Constructing Broadband Decoupling Sequences", J. Magn. Reson., 49, 517–521, 1982.
Levitt, "Supercycles For Broadband Heteronuclear Decoupling", J. Magn. Reson., 50, 157–160, 1982.
Shaka et al., "Evaluation of a New Broadband Decoupling Sequence: WALTZ-16", J. Magn. Reson., 53, 313–340, 1983.
Levitt et al., "Broadband Decoupling in High-Resolution Nuclear Magnetic Resonance Spectroscopy", Advances in Magnetic Resonance, vol. 11, 47–110, 1983.
Levitt et al., "Composite Pulses Constructed by a Recursive Expansion Procedure", J. Magn. Reson., 55, 247–254, 1983.
Shaka et al., "Composite Pulses With Dual Compensation", J. Magn. Reson., 55, 487–493, 1983.
Levitt et al., "Improvement of Pulse Performance in N.M.R. Coherence Transfer Experiments A Compensated Inadequate Experiment", Molecular Physics, vol. 50, 1109–1124, 1983.
Bodenhausen et al., "Suppression of Artifacts in Two-Dimensional J Spectroscopy", J. Magn. Reson., 27, 1977.
Kaiser et al., "Diffusion and Field-Gradient Effects in NMR Fourier Spectroscopy", J. Chem. Phys., vol. 60, 2966–2979, 1974.
Bendall et al., "Depth and Refocusing Pulses Designed for Multipulse NMR with Surface Coils", J. Magn. Reson., 53, 365–385, 1983.
Tycko, "Broadband Population Inversion", Physical Review Letters, vol. 51, 775–777, 1983.

Primary Examiner—Stewart J. Levy
Assistant Examiner—Kevin D. O'Shea
Attorney, Agent, or Firm—Stanley Z. Cole; Gerald M. Fisher; Edward H. Berkowitz

[57] ABSTRACT

Increased spatial sensitivity (FIGS. 4) or spatial tolerance (FIGS. 1) in selectively manipulated NMR sample analysis is excited from a spatially inhomogeneous FR field using pulse sequences which operate to exclude all spins deviating from a selected initial orientation (FIGS. 4 and 5) or to inclusively extend the applicable flip angles over a range of initial spin orientation (FIGS. 1).

20 Claims, 5 Drawing Figures

SPATIALLY SELECTIVE NUCLEAR MAGNETIC RESONANCE PULSE SEQUENCES

FIELD OF THE INVENTION

The present invention pertains to nuclear magnetic resonance apparatus employing a spatially inhomogeneous RF field and particularly relates to achieving enhanced spatial discrimination or enhanced spatial independence in respective types of applications.

LITERATURE REFERENCES

1. M. H. Levitt and R. Freeman, *J. Magn. Reson.* 33, 473 (1979).
2. R. Freeman, S. P. Kempsell and M. H. Levitt, *J. Magn. Reson.* 38, 453 (1980).
3. M. H. Levitt and R. Freeman, *J. Magn. Reson.* 43, 65 (1981).
4. M. H. Levitt and R. Freeman, *J. Magn. Reson.* 43, 502 (1981).
5. A. J. Shaka, J. Keeler, T. Frenkiel and R. Freeman, *J. Magn. Reson.* 52, 335 (1983).
6. R. Freeman and J. Keeler, *J. Magn. Reson.* 43, 484 (1981).
7. M. H. Levitt, R. Freeman and T. Frenkiel, *J. Magn. Reson.* 38, 453 (1980).
8. J. S. Waugh, *J. Magn. Reson.* 49, 517 (1982).
9. M. H. Levitt, R. Freeman and T. Frenkiel, *J. Magn. Reson.* 50, 157 (1982).
10. A. J. Shaka, J. Keeler and R. Freeman, *J. Magn. Reson.* 53, 313 (1983).
11. T. Frenkiel, M. H. Levitt and R. Freeman, *Adv. Magn. Reson.* 11, 47 (1983).
12. M. H. Levitt and R. R. Ernst, *J. Magn. Reson.* 55, 247 (1983).
13. A. J. Shaka and R. Freeman, *J. Magn. Reson.* 55, 487 (1983).
14. M. H. Levitt and R. R. Ernst, *Mol. Phys.* 50, 1109 (1983).
15. G. Bodenhausen, R. Freeman, and D. L. Turner, *J. Magn. Reson.* 27, 511 (1977).
16. R. Kaiser, E. Bartholdi, and R. R. Ernst, *J. Chem. Phys.* 60, 2966 (1974).
17. M. R. Bendall and R. E. Gordon, *J. Magn. Reson.* 53, 365 (1983).
18. R. Tycko, *Phys. Rev. Lett.* 51, 775 (1983).

BACKGROUND OF THE INVENTION

Almost all NMR spectra may be improved by enhancing the quality of the radiofrequency pulses used for excitation or manipulation of the nuclear spins. Ideally a pulse should be intense (so that resonance offset effects are negligible), correctly calibrated and spatially homogeneous (so that it gives the correct flip angle for all regions of the sample), and free of any phase transients. Where instrumental limitations preclude such ideal conditions, considerable progress can be made by using composite pulses—clusters of simple pulses designed for mutual compensation (Refs. 1-5). In this way the tolerance of resonance offset effects may be greatly improved, leading to more reliable results in spin echo experiments (Ref. 3), spin-lattice relaxation time measurements (Ref. 2), two-dimensional spectroscopy (Ref. 6) and broadband decoupling (Refs. 7-11). The sensitivity to errors in pulse flip angle may also be greatly reduced by suitable composite pulse sequences, and quite recently simultaneous compensation of resonance offset effects and pulse length error has been achieved (Refs. 12, 13).

The question naturally arises as to how such compensating sequences are discovered—by inspired guesswork or the application of general principles? Once a sequence has been proposed, the calculation of its offset and pulselength behaviour is a straightforward application of the Bloch equations governing the motion of an isolated magnetization vector in the rotating reference frame, and is easily evaluated by numerical methods. In many cases an expansion procedure can then be found which permits the range of compensation to be systematically improved by reapplying the principles used in the first stage. This expansion process continues until the incremental advantages no longer justify the increased length of the sequence. Suppose that the instrumental imperfection is represented by a general parameter A, and that a particular value $A_o$ can be found where the performance is ideal. This might correspond, for example, to the exact resonance condition in the case of an offset dependence study, or to the exact setting of a pulse flip angle. Since many refinement processes are cast in the formalism of power series, the tendency has been to adopt expansion schemes that start with a sequence which works correctly at this particular condition $A_o$ and then gradually extend the range of operation, essentially removing higher and higher order terms in the power series expansion. The penalty for such timidity is a slow and asymptotic improvement in performance.

A less obvious approach is to seek a pulse sequence which works exactly not only at condition $A_o$ but also at two other values of A. Typically these might be symmetrically disposed on either side of $A_o$. If the three points are not too far apart, then the 'droop' in performance at intermediate values of $A_o$ should not prove too serious. This kind of rationale led to the 90°(X) 180°(−X) 270°(X) composite inversion pulse employed in the WALTZ-16 scheme for broadband decoupling and is discussed by Refs. 5 and 10. If indeed the performance is reasonably flat over the chosen range, the same principle may then be reapplied in order to extend the compensation over a still wider range. A power series approach is still available to correct the intermediate regions if necessary.

This concept is extended here in the context of pulse flip angle errors; *resonance offset effects are deliberately neglected.* The practical interest lies in effects of spatial inhomogeneity of the $B_1$ field of the transmitter coil but the result may be simulated by deliberately mis-setting the pulse flip angle $\alpha$. Consider the case of a spin inversion pulse, 180°(X), written in shorthand form 2X where X is a 90° pulse about the X axis. The Z magnetization after an improperly set inversion pulse is shown in in FIG. 1a; it follows the curve cos ($\alpha$), slightly distorted because of the increasing effect of $B_1$ inhomogeneity at larger flip angles. The aim is to develop a composite sequence which significantly extends the range of $\alpha$ over which spin inversion is effective. The trick is to concentrate on the zero-crossings of this curve where the flip angle is 90° or 270° rather than its correct setting $\alpha = 180°$. A sequence must now be found which operates as an inversion pulse at these three points. One such sequence is $$R^1 = 2X2Y2X \tag{1}$$

Figure 1:
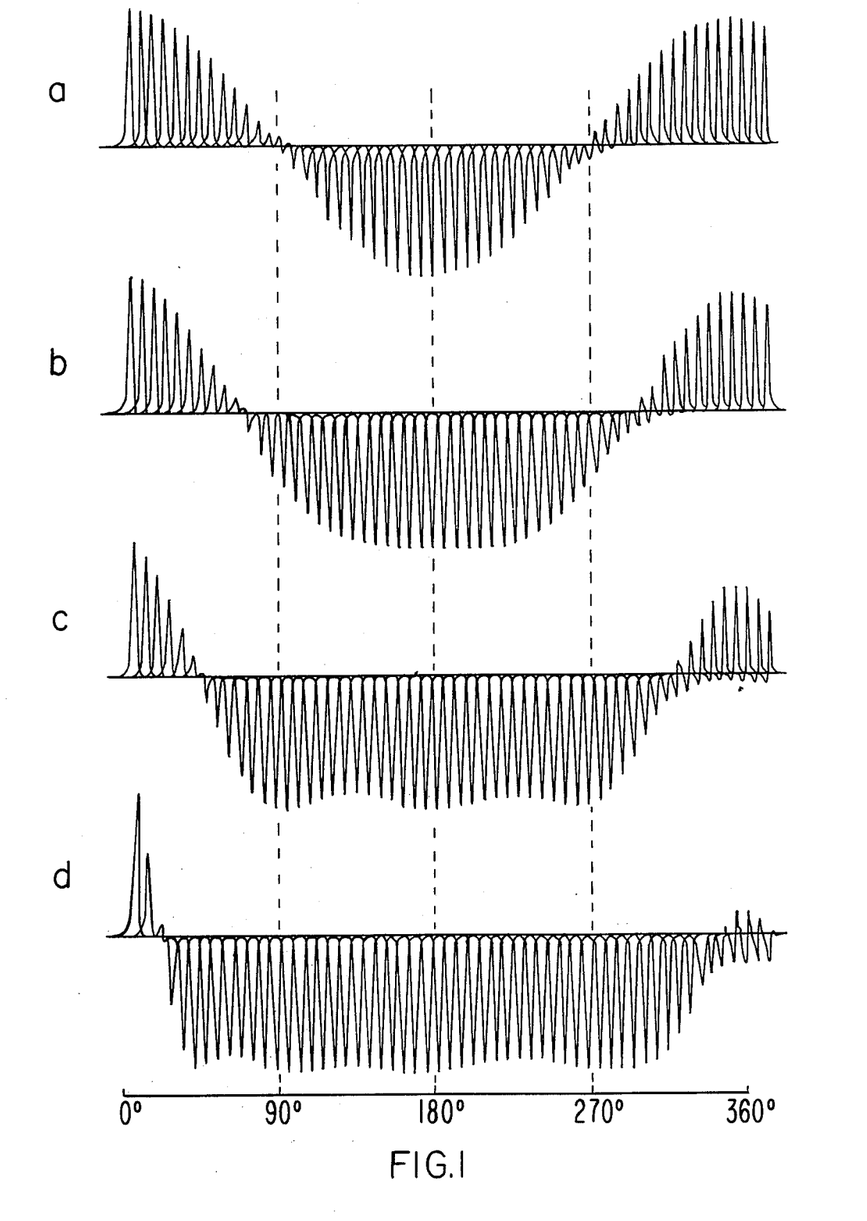
FIG. 1 illustrates dependence of signal amplitude on pulse flip angle for a non-spinning sample of 10% $H_2O$ in $D_2O$.

Its behaviour as a function of flip angle α is illustrated in FIG. 1c. Note that it shows exact spin inversion at the points where the primitive 180° pulse exhibited zero-crossings and at the correct setting α=180°. The droop in the intervening regions is not excessive and could, if necessary, be removed by a refinement scheme based on a power series expansion of the errors. Since the flip angle dependence for $R^1$ also has two zero crossings, an improved sequence $R^2$ may then be calculated to provide good inversion at these points without disturbing the performance at intermediate flip angles.

The key point is that it is possible to generalize the expansion from $R^0=2X$ to $R^1=2X2Y2X$ by an an inductive argument. This requires the concept of a 're-versed precession sequence' $[R]^{-1}$ first introduced by Levitt (Ref. 14). If R represents the 'natural' sense of rotation about a particular axis (say right-handed for protons) then $[R]^{-1}$ corresponds to the hypothetical reversed (left-handed) rotation about the same axis (Refs. 12 and 13). It must be achieved through a stratagem, in this case (where off-resonance effects are neglected) by time reversal of the sequence R and inverting all radiofrequency phases (barred symbols). In these terms the generalized expansion may be written $$R^{m+1}=R^m[R^m_{-\pi/2}]^{-1}R^m \quad [2]$$

In this equation, $R_{-\pi/2}$ represents a sequence in which all pulses have been shifted in phase by $-\pi/2$ radians. Thus if $R^1=2X2Y2X$, then $$R^1_{-\pi/2}=2\bar{Y}2X2\bar{Y}$$

and $$[R^1_{-\pi/2}]^{-1}=2Y2\bar{X}2Y.$$

The next stage of the exansion is therefore $$R^2=2X2Y2X2Y2\bar{X}2Y\ 2X2Y2X \quad [3]$$

The performance of this last sequence may be judged from FIG. 1d, where reasonably good spin inversion is achieved over a range from about α=40° to 320°. It is worth noting in passing that half of this sequence, $2X2Y2X\ 2Y\bar{X}$, serves as a compensated 90° excitation pulse.

An inversion sequence that is very tolerant of flip angle error should be useful for measuring relaxation times in living systems. These often have inherently poor uniformity of the $B_1$ field because of geometrical limitations (surface coils) or because the heterogeneity of the sample itself causes variations in radiofrequency penetration. With such samples it is particularly difficult to obtain any proper calibration of pulse flip angle; the compensated sequence renders this adjustment much less important.

In principle, a procedure for reducing the sensitivity to some pulse parameter can be made to operate in reverse. This could be particularly useful for NMR studies on living systems where it is often desirable to limit the sample region affected by the radiofrequency pulse. Now the spatial inhomogeneity of the $B_1$ field is turned to advantage. Consider an experiment where it is required to invert the nuclear spins in some selected small spatial region, leaving all other spins essentially unaffected. Reserving the symbol Q for such inversion pulses with 'retrograde compensation', one may write $$Q^1=2X\overline{2Y}2X \quad [4]$$

It is readily seen that this represents spin inversion (2Y) when the flip angle is correctly set, but a Z rotation (Z or $\overline{3Z}$) when the flip angle is set to the cross-over points (α=90° or 270°).

The general expansion procedure for this type of sequence is given by $$Q^{m+1}=Q^m[Q^m_{\pi/2}]^{-1}Q^m \quad [5]$$

The next stage of retrograde compensation is therefore $$Q^2=2X\overline{2Y2X}\ 2Y\overline{2X2Y}\ \overline{2X}2Y2X \quad [6]$$

Figure 2:
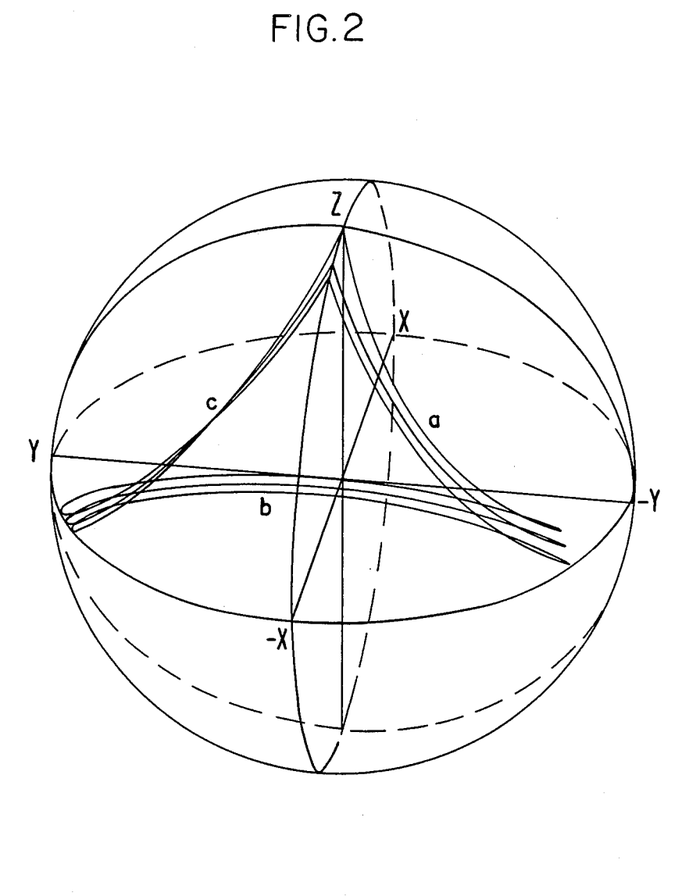
FIG. 2 illustrates magnetization trajectories calculated for the $Q^2$ sequence; Individual pulses are grouped into 'triads' and the overall equivalent rotation computed for each triad separately. The trajectories (a), (b) and (c) are respectively: (a) $2X\overline{2Y2X}$; (b) $2Y\overline{2X2Y}$; (c) $\overline{2X}2Y2X$. A family of three trajectories is shown covering the values α=135.0°, 137.7°, 140.4°. At these settings all magnetization vectors are returned towards the +Z axis.

Some insight into the operation of this sequence may be obtained by examining magnetization trajectories. For this purpose, each 'triad' of pulses (for example 2X2Y2X) is replaced by the equivalent overall rotation, and the interaction of the three triads is examined in the form of three successive arcs on the unit sphere. For all settings of the flip angle that are not close to the condition α=180°, these arcs inevitably lead back towards the +Z axis. A family of three such trajectories labeled a, b, and c, is shown in FIG. 2. Because these arcs follow roughly the outline of an equilateral triangle, the trajectories are approximately 'antitangential' at the two intermediate apices, a condition for compensating changes in flip angle.

Figure 3:
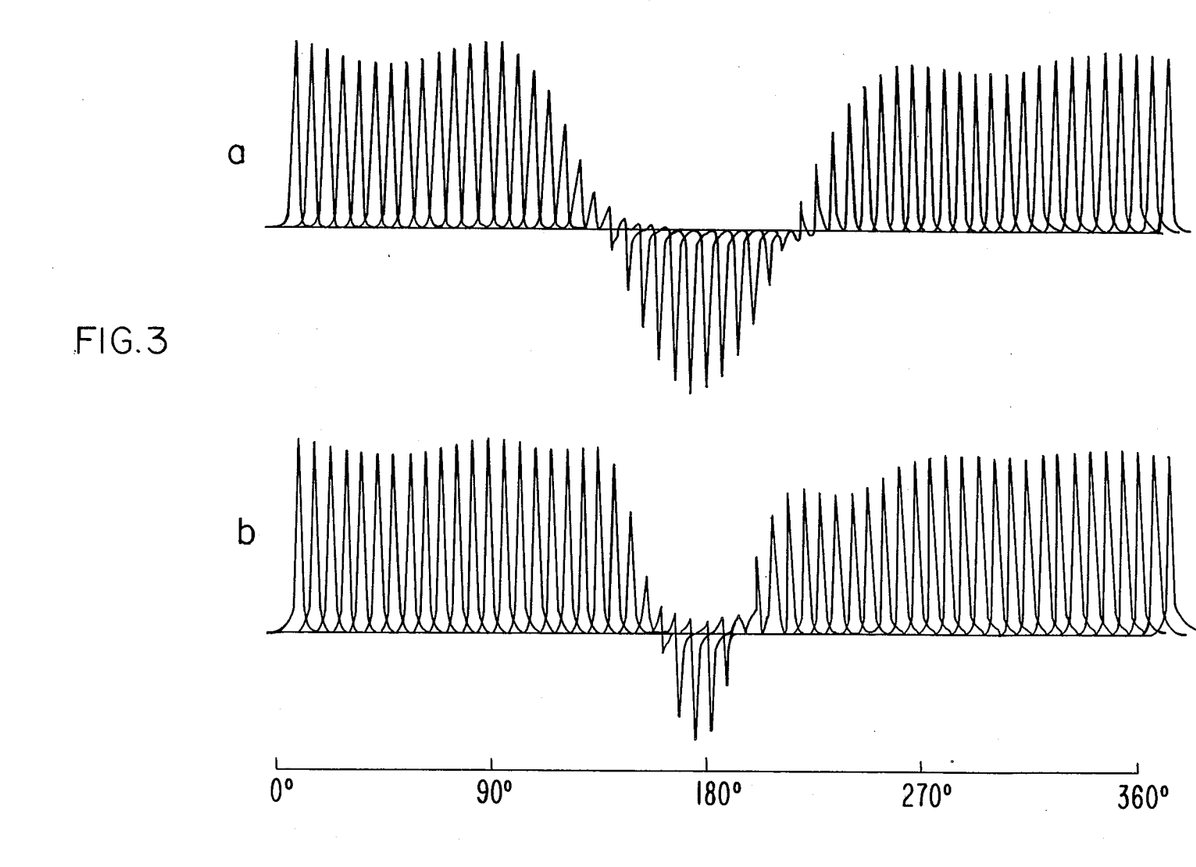
FIG. 3 illustrates spin inversion sequences with retrograde compensation.

The effectiveness of the $Q^1$ sequence for spin inversion is shown as a function of α in FIG. 3a. Note that the range for effective spin inversion is considerably more restricted than after a pure 180° pulse (FIG. 1a). This region narrows even further when the nine-pulse $Q^2$ sequence is employed. The effects of spatial inhomogeneity in $B_1$ now make their presence felt; at no single setting of the nominal flip angle does the entire sample experience an exact 180° pulse. Normally these curves would be symmetrical with respect to the condition α=180°, but since the spatial inhomogeneity effects are proportional to the flip angle, a marked asymmetry is introduced.

Retrograde inversion sequences of this kind are easily converted into spatially selective excitation sequences if the $B_1$ field is inhomogeneous. The key is the 'EXOR-CYCLE' phase cycling routine (15) designed to reject magnetization components not properly inverted by an imperfect 180° pulse. Starting with a simple 90°(X) pulse (FIG. 4a), transverse magnetization is flipped by the retrograde inversion sequence $Q^1$, the radiofrequency phases being incremented in 90° steps while the receiver phase is alternated:

| $Q^1$ | Receiver phase |
| --- | --- |
| 2X $\overline{2Y}$ $\overline{2X}$ | add |
| $\overline{2Y}$ $\overline{2X}$ 2Y | subtract |
| $\overline{2X}$ 2Y 2X | add |
| 2Y 2X $\overline{2Y}$ | subtract |

Kaiser et al (16) have shown that an imperfect inversion pulse decomposes transverse magnetization into three parts, one which experiences a perfect 180° pulse, one which reverts to Z-magnetization, and a third which experiences no pulse at all. EXORCYCLE thus retains signals acquired when α is very close to 180° but rejects signals acquired at other values of α. Furthermore, residual Z magnetization after the initial 90° pulse does not contribute to the observed signal. These cancellation effects are entirely analogous to the suppression of 'ghost' and 'phantom' signals in two-dimensional spectroscopy (15). A similar phase cycling scheme (using simple 180° pulses) has been suggested for the same purpose by Bendall and Gordon (17).

Figure 4:
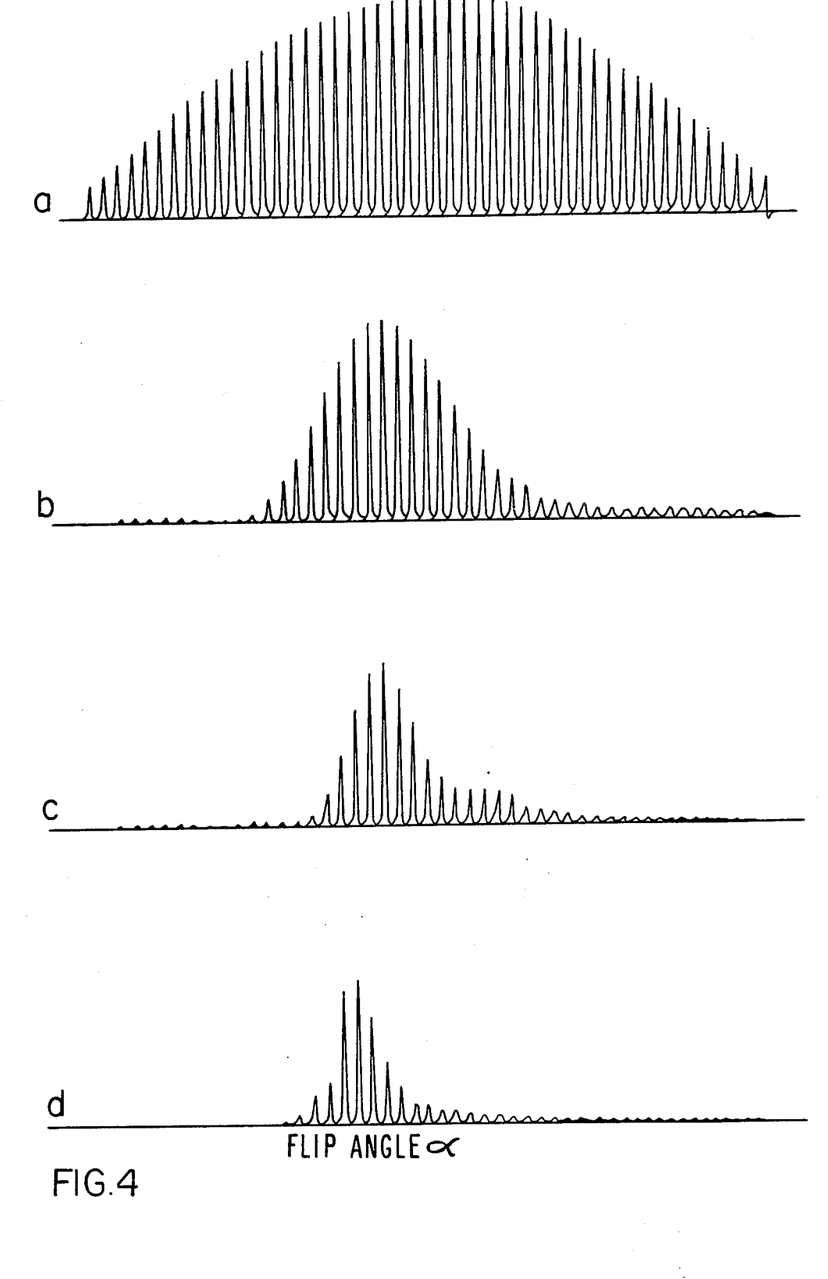

FIG. 4b shows the narrowing of the excitation pattern after the sequence X $(Q^1)_\beta$ where $\beta$ is a phase angle cycled according to the EXORCYCLE routine. This could be used in conjunction with an inhomogeneous $B_1$ field to excite a chosen small region within the sample. A further improvement in spatial selectivity (FIG. 4c) is afforded by the sequence X $(Q^2)_\beta$ since the $Q^2$ inversion performance is narrower than that of $Q^1$. Even finer discrimination can be achieved by cascading the stages in a sequence X $(Q^2)_\beta$ $(Q^2)_\gamma$, where the two phase angles $\beta$ and $\gamma$ are cycled independently (16 steps). This very narrow excitation curve is shown in FIG. 4d.

In all of the treatment presented above, resonance offset effects have been deliberately neglected, allowing reversed precession sequences to be engineered by time reversal and phase inversion. The question of compensation for resonance offset is deferred for the moment.

The most exciting application of these new sequences appears to be the spatially selective excitation of NMR responses from living animals, using an inhomogeneous $B_1$ radiofrequency field. The next step is to investigate the effectiveness using suitable phantom samples. The principles outlined above are, however, more general. For example, other expansions are possible such as $$\Lambda^{m+1} = \Lambda^m[\Lambda^m_{-\pi/3}]^{-}\Lambda^m \quad [7]$$

The sense of the 60° radiofrequency phase shift is only relevant if this expansion is combined with an R sequence. These Λ sequences possess a similar tolerance to flip angle variation as do the R sequences, but a much flatter curve without the undulations of FIGS. 1c and 1d. The first stage of such an expansion, 180°₀ 180°$_{2\pi/3}$ 180°₀, has already been discovered by a perturbation approach (18). Retrograde compensation is achieved through the expansion of the present invention $$\Delta^{m+1} = \Delta^m[\Delta^m_{\pi/3}]^{-1}\Delta^m_{2\pi/3} \quad [8]$$

Figure 5:
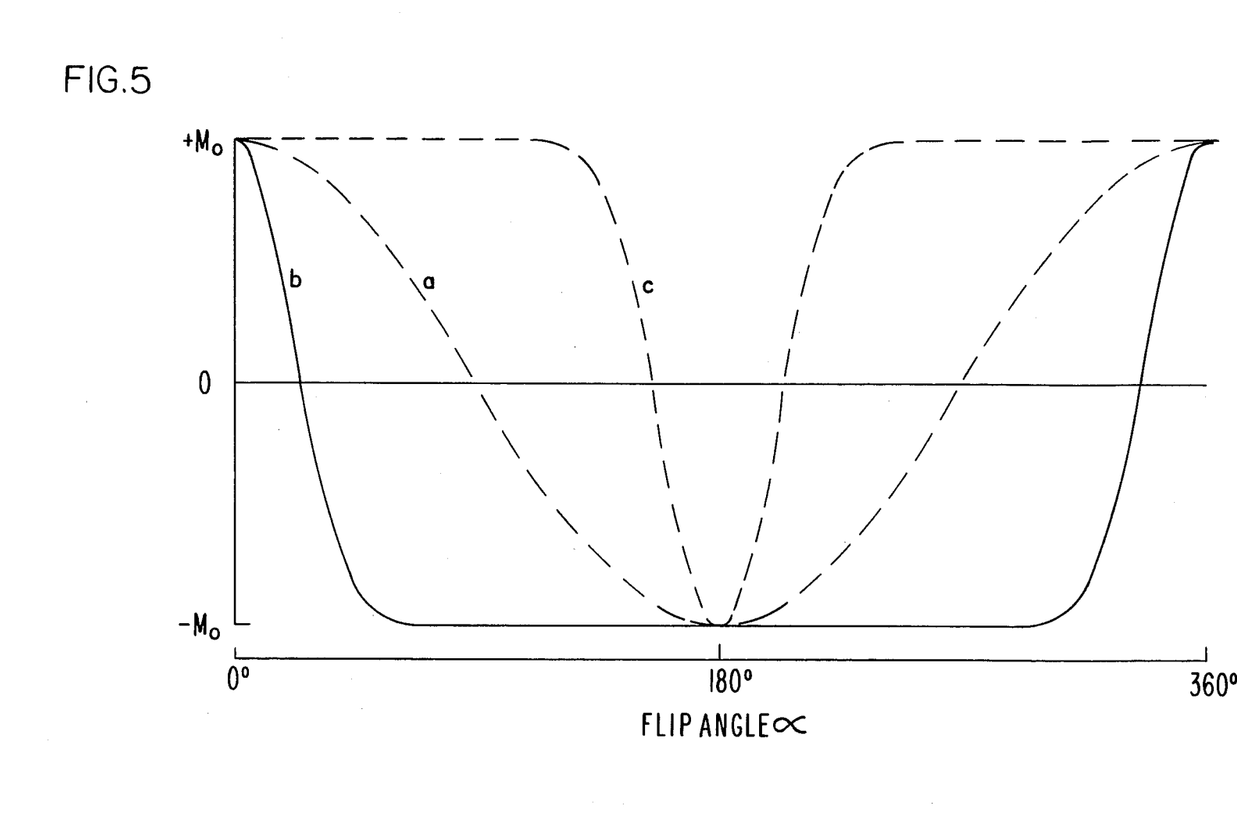
FIGS. 5(a)–(c) show simulated performance of spin inversion sequences as follows; (a) A simple 180° pulse; (b) The hybrid compensated sequence $\Lambda = (2X2Y2X)_O$ $(\overline{2X2Y2X})_{-\pi/3}$ $(2X2Y2X)_O$; (c) The hybrid retrograde sequence $\Delta = (2X\overline{2Y2X})_O$ $(2X2Y\overline{2X})_{\pi/3}$ $(2X\overline{2Y2X})_{2\pi/3}$. This last sequence would provide excellent spatial selectivity in an inhomogeneous $B_1$ field.

Again the sense of phase rotation is only relevant if the Λ expansion is to be combined with a Q sequence (which itself possesses a sense of phase rotation). For example, the Λ or Δ schemes may be used to operate on $R^1 = 2X2Y2X$ or $Q^1 = 2X\overline{2Y2X}$ (respectively) in order to obtain very wide flat regions of the curve representing flip angle dependence. The performance of such hybrid pulse sequences is calculated in FIG. 5, with a simple 180° pulse for comparison. The compensated Λ sequence is $$(2X2Y2X)_O \, (\overline{2X2Y2X})_{-\pi/3} \, (2X2Y2X)_O,$$

while the new Δ sequence for retrograde compensation is $$(2X\overline{2Y2X})_O \, (\overline{2X2Y2X})_{\pi/3} \, (2X\overline{2Y2X})_{2\pi/3}.$$

The price of this degree of refinement is the unaccustomed practical requirement for 60° and 120° radiofrequency phase shifts.

Finally, radiofrequency offset effects may be treated on the same footing as flip angle errors, generating new families of inversion pulses compensated for offset or even for offset and pulselength mis-set simultaneously.

FIGURES BRIEFLY SUMMARIZED

The figures appended hereto are briefly described as follows:

FIG. 1 shows the results of a simple pulse $R^0 = 2X$; FIG. 1(b) shows the well-known composite pulse X2YX. FIG. 1(c) shows the new sequence $R^1 = 2X2Y2X$. (d) The new sequence $R^2 = 2X2Y2X$ $2Y\overline{2X}2Y$ $2X2Y2X$;

FIG. 3 (a) shows $Q^1 = 2X\overline{2Y2X}$. FIG. 3(b) shows $Q^2 = 2X\overline{2Y2X}$ $2Y\overline{2X2Y}$ $\overline{2X}2Y2X$. There is efficient inversion only for a small range of flip angles near the condition α=180°; elsewhere magnetization is returned towards the +Z axis. The asymmetry with respect to α=180° is attributed to the effects of spatial inhomogeneity of the $B_1$ field.

FIGS. 4(a), (b) and (c) show sequences designed to excite a restricted region of the sample by exploiting the spatial inhomogeneity of the $B_1$ field. The sample is 10% $H_2O$ in $D_2O$. FIG. 4(a) shows A single pulse (no compensation). The other traces show retrograde compensation. FIG. 4(b) shows a sequence X $(Q^1)_\beta$. FIG. 4(c) shows the sequence X $(Q^2)_\beta$. FIG. 4(d) shows the sequence X $(Q^2)_\gamma$. EXORCYCLE phase cycling operates on $\beta$ and $\gamma$ independently. Because of $B_1$ inhomogeneity, it was not feasible to make a satisfactory calibration of the flip angle.

Although the invention has been shown and described with reference to preferred embodiments, it will be understood that the invention is applicable over a wider scope than the specific examples given. It is clear that the enhancement of spatial sensitivity to, and the enhancement of spatial independence of RF field inhomogeneity is but one aspect and is capable of refinement to a selectable higher degree, m. It will therefore be readily apparent to one of average skill in the art that various changes in form and arrangement of the invention may be made to satisfy requirements thereof without departing from the scope of the invention as defined by the claims.

What is claimed is:

1. The method of exciting nuclear magnetic resonance in an exclusively selected aggregate of gyromagnetic resonators comprising the steps of
   (a) imposing a polarizing magnetic field on said gyromagnetic resonators,
   (b) flipping the magnetization representing said selected resonators by 180° about a first selected axis in a selected plane whereby the magnetization is re-oriented 180° as the first step of a composite continuous set of steps $Q^m$,
   (c) applying an RF pulse to cause the magnetization vector to rotate by 180° about a second axis as another step of said composite continuous set $Q^m$, said second axis at +90° to said selected axis,
   (d) flipping the magnetization by 180° as another step of said composite continuous set $Q^m$, said flipping reversed in sense from the flipping of step (b) whereby the step (b) is time reversed,
   (e) accumulating a nuclear magnetic resonance signal, and
   (f) repeating steps (b) through (c) at least through three further repetitions and for each said repetition,
      (1) cycling each said rotation or flip axis by advancing said axis 90° in the selected plane with respect to the preceding repetition, and
      (2) reversing the algebraic sense of accumulation of the NMR signal for each adjacent accumulation.

2. The method of claim 1 wherein steps (a) and (c) are reversed in sequence as the initial step of the composite set $Q^m$.

3. The method of claim 2 wherein each said steps (b), (c) and (d) comprise composite RF pulses from a set $Q^{m+1}$ which is related to composite set $Q^m$ by advancing the pulse of the RF pulse associated with each component rotation and flip step of the composite set $Q^m$ by 90° and reversing the sequence of the constituent rotations at flips of said step $Q^m$.

4. The method of claim 3 comprising preceding the composite set $Q^m$ by the step of applying an initial tipping pulse to tip the magnetization of said resonators with respect to said polarizing magnetic field, said tipping occurring about a second selected axis.

5. The method of claim 4 wherein said first and second selected axes are identical.

6. The method claim 4 wherein said first and second selected axes are non-identical.

7. The method of claim 5 or 6 wherein said step of applying an initial tipping is a discrete step separated by an interval from said composite set $Q^m$.

8. The method of claim 5 or 6 wherein said step of applying an initial tipping is an initial step of a composite set pulse including said composite $Q^m$.

9. The method of claim 7 wherein said initial tipping orients the selected resonators in the plane transverse to the polarizing magnetic field.

10. The method of claim 8 wherein said initial tipping orients selected resonators in the plane transverse to the polarizing magnetic field.

11. The method of exciting nuclear magnetic resonance in an inclusively selected aggregate of gyromagnetic resonators comprising the steps of
    (a) imposing a polarizing magnetic field on said gyromagnetic resonators,
    (b) flipping the magnetization representing said selected resonators by 180° about a first selected axis in a selected plane whereby the magnetization is re-oriented 180° as the first step of a composite continuous set of steps $R^m$,
    (c) applying an RF pulse to cause the magnetization vector to rotate by 180° about a second axis as another step of said composite continuous set $R^m$, said second axis at −90° to said selected axis,
    (d) flipping the magnetization by 180° as another step of said composite continuous set $R^m$, said flipping identical in sense from the flipping of step (b) whereby the step (b) is time reversed,
    (e) accumulating a nuclear magnetic resonance signal, and
    (f) repeating steps (b) through (c) at least through three further repetitions and for each said repetition,
       (1) cycling each said rotation or flip axis by advancing said axis 90° in the selected plane with respect to the preceding repetition, and
       (2) reversing the algebraic sense of accumulation of the NMR signal for each adjacent accumulation.

12. The method of claim 11 wherein steps (a) and (c) are reversed in sequence as the initial step of the composite set $R^m$.

13. The method of claim 12 wherein each said steps (b), (c) and (d) comprise composite RF pulses from a set $R^{m+1}$ which is related to set $R^m$ by advancing the phase of the pulse associated with each component rotation and flip step of $R^m$ by 90° and reversing the sequence of the constituent rotations and flips of said set $R^m$.

14. The method of claim 13 wherein each said steps (b), (c) and (d) comprise composite RF pulses from a set $R^{m+1}$ which is related to composite set $R^m$ by advancing the pulse of the RF pulse associated with each component rotation and flip step of the composite set $R^m$ by 90° and reversing the sequence of the constituent rotations at flips of said step $R^m$.

15. The method of claim 14 wherein said first and second selected axes are identical.

16. The method claim 14 wherein said first and second selected axes are non-identical.

17. The method of claim 15 or 16 wherein said step of applying an initial tipping is a discrete step separated by an interval from said composite set $R^m$.

18. The method of claim 15 or 16 wherein said step of applying an initial tipping is an initial step of a composite set pulse including said composite $R^m$.

19. The method of claim 17 wherein said initial tipping orients the selected resonators in the plane transverse to the polarizing magnetic field.

20. The method of claim 18 wherein said initial tipping orients selected resonators in the plane transverse to the polarizing magnetic field.

* * * * *

UNITED STATES PATENT AND TRADEMARK OFFICE
CERTIFICATE OF CORRECTION

PATENT NO. : 4,710,718

DATED : December 1, 1987

INVENTOR(S) : Athan J. Shaka

It is certified that error appears in the above-identified patent and that said Letters Patent is hereby corrected as shown below:

Column 7,
  Claim 2, line 1: change "(a)" to --(b)--.
  Claim 12, line 1: change "(a)" to --(b)--.

Signed and Sealed this

Nineteenth Day of February, 1991

Attest:

HARRY F. MANBECK, JR.

Attesting Officer

Commissioner of Patents and Trademarks